US012559844B2

(12) United States Patent
Krumm et al.

(10) Patent No.: US 12,559,844 B2
(45) Date of Patent: Feb. 24, 2026

(54) METHOD FOR PRODUCING A CUTTING TOOL

(71) Applicant: ROLLOMATIC S.A, Le Landeron (CH)

(72) Inventors: Christian Krumm, Cortebert (CH); Carole Moureaux, Morteau (FR); Thibaut Saillard, Besancon (FR)

(73) Assignee: ROLLOMATIC S.A., Rue des Pres Bugnons (CH)

( * ) Notice: Subject to any disclaimer, the term of this patent is extended or adjusted under 35 U.S.C. 154(b) by 46 days.

(21) Appl. No.: 18/949,661

(22) Filed: Nov. 15, 2024

(65) Prior Publication Data

US 2025/0137137 A1 May 1, 2025

Related U.S. Application Data

(63) Continuation of application No. PCT/EP2023/063370, filed on May 17, 2023.

(30) Foreign Application Priority Data

May 17, 2022 (EP) .................................... 22173898

(51) Int. Cl.
*C23C 14/58* (2006.01)
*C23C 16/27* (2006.01)
*C23C 16/56* (2006.01)

(52) U.S. Cl.
CPC .............. *C23C 16/56* (2013.01); *C23C 16/27* (2013.01); *B23B 2228/105* (2013.01)

(58) Field of Classification Search
CPC ...... C23C 16/56; C23C 16/27; C23C 14/5813
See application file for complete search history.

(56) References Cited

U.S. PATENT DOCUMENTS

| | | | | |
|---|---|---|---|---|
| 5,178,645 A | * | 1/1993 | Nakamura | C23C 16/271 |
| | | | | 51/293 |
| 5,366,522 A | * | 11/1994 | Nakamura | C23C 16/277 |
| | | | | 51/293 |
| 10,835,992 B2 | * | 11/2020 | Kaiser | B23K 26/0648 |
| 2020/0269366 A1 | | 8/2020 | Shamoto et al. | |
| 2021/0299792 A1 | * | 9/2021 | Shamoto | B23K 26/705 |
| 2021/0299810 A1 | | 9/2021 | Shamoto | |

FOREIGN PATENT DOCUMENTS

| | | | | |
|---|---|---|---|---|
| DE | 102009004316 A1 | 7/2010 | | |
| DE | 102011076584 A1 | 11/2012 | | |
| EP | 2682219 A1 | 1/2014 | | |
| EP | 2848716 A1 | * 3/2015 | ............. | C03B 29/04 |
| EP | 3674022 A1 | 7/2020 | | |
| JP | H0811005 A | 1/1996 | | |
| JP | 2007 307 673 | 11/2007 | | |
| JP | 2007307673 A | 11/2007 | | |
| JP | 2016175141 A | 10/2016 | | |
| JP | 2019-63904 | * 4/2019 | .............. | B23C 5/10 |
| WO | WO 2018061355 A1 | 4/2018 | | |

OTHER PUBLICATIONS

Bobzin, Kirsten, "High-performance coatings for cutting tools". CIRP Journal of Manufacturing Science and Technology 18 (2017) 1-9.*
Hazzan, Kafayat Eniola, et al., "Laser Processing of Hard and Ultra-Hard Materials for Micro-Machining and Surface Engineering Applications". Micromachines, 2021, 12, 895, pp. 1-46.*
Ghosh, Priyanka, et al., "Effect of laser texturing on the performance of ultra-hard single-point cutting tools". The International Journal of Advanced Manufacturing Technology (2020) 106:2635-2648.*
Zimmermann, Marco, et al., "Influence of the laser parameters on the cutting edge preparation and the performance of cemented carbide indexable inserts". Journal of Manufacturing Processes 58 (2020) 845-856.*
Kwak, Yein, et al., "Influence of cutting-edge radius by an edge-honing process on the cutting tool life and coating". Journal of Mechanical Science and Technology 38 (10) 2024, 5595-5604.*
Feng, Yixuan, et al., "Flank tool wear prediction of laser-assisted milling". Journal of Manufacturing Processes, vol. 43, Part A, Jul. 2019, pp. 292-299.*

* cited by examiner

*Primary Examiner* — Bret P Chen
(74) *Attorney, Agent, or Firm* — Von Rohrscheidt Patents

(57) ABSTRACT

A method for producing a cutting tool including a tool body including a hard coating, the method comprising: applying the hard coating to the tool body at least in an area of a cutting edge, a flank, and a chipping surface; depositing the hard coating on a surface of the tool body, of the cutting tool in an area of the cutting edge, of the flank adjacent to the cutting edge, and of the chipping surface adjacent to the cutting edge; sharpening the cutting edge that is provided with the hard coating and that forms a dull rounded edge by partially removing the hard coating in the area of the flank of the cutting edge by laser machining to form a sharpened cutting edge so that an angle δ is enclosed between a first geometric plane in which a surface of the tool body extends.

17 Claims, 9 Drawing Sheets

METHOD FOR PRODUCING A CUTTING TOOL

RELATED APPLICATIONS

This application is a continuation of international patent application PCT/EP2023/063370 filed on May 17, 2023 claiming priority from European patent application 22 17 38 98.2 filed on May 17, 2022, both of which are incorporated in their entirety by this reference.

FIELD OF THE INVENTION

The invention relates to a method for producing a cutting tool including at least one cutting edge, wherein the cutting tool includes a tool body that includes a hard coating at least in an area of the cutting edge.

BACKGROUND OF THE INVENTION

Cutting tools include chipping tools for chip generating fabrication methods and tools for cutting parts apart. The cutting tools typically include a shaft and a cutting portion. Thus, an end section of the shaft is used for supporting the cutting tool, e.g. in a machine interface of a machine tool. The cutting portion is arranged at the shaft. The cutting portion includes at least one cutting edge that interacts with a workpiece to be machined and removes material from the workpiece. Typical cutting tools are mill bits, drill bits, reamers, chisels, scrapers, planers, and saws. Thus, the cutting tool can be a massive tool which is integrally made from a single material. As an alternative the cutting portion can also include an insert that includes the cutting edge, wherein the insert is made from a different material than the shaft. Cutting tools are subject to substantial mechanical and thermal loads at their engagement location due to acting forces and generated temperatures. Among these are mechanical friction, oxidation and abrasion and diffusion and scaling due to high machining speeds. This wears the cutting tool at its cutting edge.

Therefore, cutting tools are provided with a hard coating in a portion of the cutting edge in order to improve wear resistance of the cutting tools and increases service life. The hard coating is applied to the tool body. Hard coatings are e.g. diamond coatings, amorphous carbon layers also designated as Diamond Like Carbon DLC and titanium coatings. These coatings are applied e.g. by chemical vapor deposition CVD at the tool body. The coated cutting edge has a dull rounded edge after depositing the hard coating. The dull rounded edge has to be sharpened thereafter in order to provide a cutting edge with the desired edge radius. A portion of the hard coating is therefore removed from the cutting edge for this purpose. Sharpening the cutting edge by removing a portion of the hard material from the surface of the cutting tool can be performed e.g. by a laser machine tool. This material removal is also designated as laser ablation or laser evaporation. The material can be removed e.g. in layers. Thus, the laser beam is oriented substantially orthogonal to the surface where a portion of the hard coating is removed. This portion can be the flank or the chipping surface. A generic method is known e.g. from DE 10 2009 004 316 A 1 and DE 10 2011 076 584 A 1. Furthermore, there is the option to cut off a portion of the hard coating by continuous or pulsed laser radiation, wherein the laser beam is oriented essentially parallel to the surface to be generated. A generic method is known e.g. from EP 2 682 219 A 1. Thus, the laser beam can be directed towards the cutting tool to be machined, so that material removal starts in the portion of the cutting edge to be generated as illustrated in FIG. 1 of EP 2 682 219 A 1. This is also designated as frontal material removal. Alternatively, the material removal can also commence at a side of the cutting tool that is oriented away from the cutting edge to be generated as illustrated in FIG. 3 of EP 2 682 219 A 1. This is also designated as backside material removal. The parameters of the laser machining have to be adapted to the material to be machined and the intended machining. The material removal can be performed at the flank, at the chipping surface or at both surfaces.

Sharpening the coated cutting edge is typically performed so that a wedge angle of the cutting wedge of the uncoated tool body formed by the flank and the chipping surface coincides with the wedge angle of the coated and resharpened cutting wedge. This method, however, has the disadvantage that the laser beam can be deflected in an undesirable manner at a secondary flank or another surface of the cutting tool that is neither the flank nor the chipping surface when the laser beam is oriented parallel to a surface to be generated and when material is removed from the backside. This deflection of the laser beam can have the effect that the laser machining does not provide the intended sharpening of the cutting edge.

BRIEF SUMMARY OF THE INVENTION

Thus, it is an object of the invention to provide a method for producing a hard coated cutting tool where a predetermined edge radius of the coated cutting edge can also be reliably achieved when a portion of the hard coating is removed by a laser beam in order to sharpen the coated cutting edge, wherein the laser beam is not oriented perpendicular to the surface of the cutting tool to be generated and the material removal can also be performed from the backside.

This object is achieved by a method for producing a cutting tool including a tool body including a hard coating, the method comprising: applying the hard coating to the tool body at least in an area of a cutting edge, a flank, and a chipping surface; depositing the hard coating on a surface of the tool body, of the cutting tool in an area of the cutting edge, of the flank adjacent to the cutting edge, and of the chipping surface adjacent to the cutting edge; sharpening the cutting edge that is provided with the hard coating and that forms a dull rounded edge by partially removing the hard coating in the area of the flank of the cutting edge by laser machining to form a sharpened cutting edge so that an angle δ is enclosed between a first geometric plane in which a surface of the tool body extends, wherein the surface of the tool body is arranged below the hard coating of the flank, and a second geometric plane in which a surface of the hard coating defined by the sharpened cutting edge extends in the area of the flank after partial hard coating removal, wherein $1° \leq δ \leq 70°$.

The method is characterized in that the surface of the hard coating in the portion of the flank is not parallel to the underlying surface of the tool body after partial material removal but that a first geometric plane in which the surface of the tool body extends under the hard coating of the flank and a second geometric plane in which a surface of the hard coating defined by the sharpened cutting edge extends in the portion of the flank after completion of the material removal enclose an angle δ, wherein $1° \leq δ \leq 70°$. This is done in view of the fact that the surface of the tool body arranged under the coating terminates at the uncoated cutting edge, while the geometric plane in which the surface of the tool body extends runs into infinity. The surface of the hard coating in the area of the flank terminates at the sharpened cutting edge after partial material removal, whereas the second geometric plane extends into infinity. The first geometric plane and the second geometric plane intersect along a geometric straight line. The geometric straight line can coincide with the uncoated cutting edge of the tool body, coincide with the sharpened cutting edge of the cutting tool, extend outside of the tool body and inside the hard coating at the chipping surface, or extend outside of the cutting tool.

The surface of the hard coating is advantageously inclined in the portion of the flank after completion of material removal, so that the layer thickness of the hard coating at the flank increases from the cutting edge with an increasing distance from the cutting edge. When a hard coating with a uniform layer thickness is deposited at the cutting edge, at the flank and at the chipping surface, a certain amount of material only has to be removed directly at the cutting edge during a subsequent resharpening of the cutting edge. An amount of the material of the hard coating that has to be removed increases with an increasing distance from the cutting edge. Thus, a cutting edge with a predetermined edge radius is generated and more material of the hard coating remains at the cutting tool. Since less material has to be removed, the material removal is performed in a shorter amount of time.

The cutting tool can be elongated and extend along a geometric longitudinal axis. Among these cutting tools are mill bits and drill bits. The at least one cutting edge can be a main cutting edge or a secondary cutting edge. The at least one cutting edge can be arranged at a face of the elongated cutting tool or can extend along the shaft in a portion of a chip flute.

The material removal from the hard coating is performed by laser machining. Thus, a laser beam of a laser machine tool is oriented at a predetermined angle relative to the surface of the hard coating at the flank in order to partially remove the hard coating. Thus, the angle at which the laser beam is aligned with its geometric beam axis relative to the surface of the coated cutting tool is a function of the angle $\delta$ enclosed by the first geometric plane and the second geometric plane after completion of material removal. Advantageously, the laser beam is oriented so that the geometric beam axis runs parallel or tangential to the surface to be generated at the flank. Since the laser beam is typically focused on a surface of the cutting tool, the opening angle of the laser beam is advantageously considered when orienting the laser beam. When the hard coating has a uniform layer thickness after layer application in the portion of the flank, a geometric axis of the laser beam can be oriented at the angle $\delta$ relative to the surface to be generated at the beginning of the material removal. When the opening angle of the focused laser beam is considered, the angle corresponds to the sum of half the opening angle and the angle $\delta$. Thus, the hard coating can be removed in particular from behind. This means that the material removal starts in a section of the flank that is oriented away from the sharp cutting edge to be generated. This avoids an undesirable deflection of the laser beam. This furthermore assures that all spots where the laser beam impacts the cutting tool are removed during the material removal. Therefore, the surface generated at the flank is smooth. This surface has good surface quality and a sharpened cutting edge with a predetermined edge radius is produced in the desired quality.

According to an advantageous embodiment a hard coating with a layer thickness between two 2 $\mu$m and 40 $\mu$m is deposited on the tool body.

According to another advantageous embodiment of the invention the hard coating is removed so that the following holds for the angle $\delta$: $2°\leq\delta\leq10°$ advantageously $3°\leq\delta\leq6°$. The angle $\delta$ is typically a function of the layer thickness of the hard coating at the flank, a material of the hard coating, and an edge angle of the cutting wedge.

According to another advantageous embodiment of the invention the hard coating is removed so that the following holds for the angle $\delta$: $30°\leq\delta\leq70°$. This range for the angle $\delta$ is advantageous e.g. when the first geometric plane and the second geometric plane intersect along a geometric straight line that coincides with the uncoated cutting edge of the tool body. This exposes the uncoated cutting edge. This avoids mechanical and thermally induced tensions between the tool body and the hard coating.

According to another advantageous embodiment of the invention the thickness of the hard coating at the flank is reduced during partial removal of the hard coating so that the thickness of the hard coating increases at the flank from the sharpened cutting edge with increasing distance from the sharpened cutting edge.

According to another advantageous embodiment of the invention the first geometric plane and the second geometric plane intersect at the uncoated cutting edge. In this case, the tool body is relieved from the hard coating in the area of the uncoated cutting edge. This avoids mechanically and thermally induced tensions between the tool body and the hard coating.

According to another advantageous embodiment of the invention a geometric beam axis of the laser beam is oriented during laser machining so that the beam axis encloses the angle $\delta$ with the first geometric plane. The beam axis of the laser beam runs parallel or tangential to the second plane in this embodiment. The geometric beam axis is thus a straight line in a mathematical sense that extends into infinity and thus through the hard coating.

According to another advantageous embodiment of the invention the beam axis of the laser beam is oriented during laser machining so that the beam axis encloses an angle $\alpha$ with the second geometric plane, wherein $1°\leq\alpha\leq10°$. This considers the fact that the laser beam can be focused on the surface of the workpiece and therefore includes an opening angle. Advantageously the angle $\alpha$ corresponds to half the opening angle of the laser beam.

According to another advantageous embodiment of the invention material removal of the hard coating commences at the flank of the hard coating in a section of the flank that is remote from the cutting edge and terminates at the chipping surface. In this case material is removed from the backside.

According to another advantageous embodiment of the invention the cutting edge provided with the hard coating is sharpened by additional partial removal of the hard coating in the area of the chipping surface so that $0°\leq\varepsilon\leq70°$ holds after partial removal of the hard coating for an angle $\varepsilon$ between a third geometric plane in which the surface of the tool body arranged under the hard coating of the chipping surface extends and a fourth geometric plane in which the surface of the hard coating defined by the sharpened cutting edge extends in the area of the partial material removal. Thus, the angle $\delta$ coincides with the angle $\varepsilon$ with respect to size or it can differ therefrom. In this case not only the layer thickness of the hard coating at the flank is reduced for resharpening the cutting edge after depositing the hard coating, but the layer thickness of the hard coating is reduced at the chipping surface as well. Thus, the material removal can be performed so that the surface newly formed after the material removal runs parallel to the surface of the tool body arranged thereunder, thus $\varepsilon=0°$, or the newly formed surface encloses an angle different from 0° with the surface of the tool body. In the latter case, the layer thickness at the chipping surface is reduced like the layer thickness at the flank so that the layer thickness of the hard coating increases starting from the cutting edge with an increasing distance from the cutting edge.

According to another embodiment of the invention the hard coating is removed from the chipping surface so that the following holds for the angle $\varepsilon$: $2°\leq\varepsilon\leq10°$, particularly advantageously $3°\leq\varepsilon\leq6°$.

According to another advantageous embodiment of the invention the thickness of the hard coating at the chipping surface is reduced during partial removal of the hard coating so that the thickness of the hard coating at the chipping surface increases from the sharpened cutting edge with an increasing distance from the cutting edge.

According to another advantageous embodiment of the invention a diamond layer is deposited at the tool body as the hard coating. Thus, the diamond layer can be a crystalline or a polycrystalline diamond layer. The latter have a heterogenous distribution of the size of the crystalline diamonds. Instead of diamond a hard coating made from DLC, from a nitride-based material e.g. titanium nitride or another material including titanium or another material suited for hard coating can be applied to the tool body. The abbreviation DLC stands for Diamond Like Carbon. This type of hard coating is also designated as amorphous diamond.

According to another advantageous embodiment of the invention the hard coating at the flank is completely removed at least in sections so that the tool body is exposed in the respective section. This applies in particular to the uncoated cutting edge of the tool body and optionally also to an adjacent portion. The hard coating is removed from the tool body at or proximal to the cutting edge. This avoids or at least reduces mechanical or thermal tensions between the tool body and the hard coating.

According to an advantageous embodiment of the invention the hard coating is removed from the chipping surface completely at least in sections so that the tool body is exposed in the respective section. Advantageously the tool body is exposed in the portion of the uncoated cutting edge of the tool body. This avoids mechanical and/or reduces thermal tensions in the tool body.

According to another advantageous embodiment of the invention the laser machining is performed with a pulsed laser beam wherein a pulse duration is between 50 ns and 150 fs. Machining with these ultra short laser pulses has the advantage that a very high energy density is generated at the surface of the workpiece in a locally defined area and material is thus removed without a heat in the workpiece being able to propagate in an undesirable manner.

According to another advantageous embodiment of the invention the pulse duration is between 190 fs and 10 ps.

According to another advantageous embodiment of the invention the pulse frequency is between 100 kHz and 1,000 kHz.

According to another advantageous embodiment of the invention the average laser power is between 4 W and 40 W. A machining speed relative to the CNC controlled machine axes of a laser machine tool in a range of 10 mm/min to 40 mm/min can be achieved at a pulse duration between 190 fs and 10 ps, a pulse frequency between 100 kHz and 1,000 kHz and an average laser power between 4 W and 40 W.

According to another advantageous embodiment of the invention the pulse duration is between 6 ns and 45 ns and a pulse frequency is between 15 kHz and 200 kHz. In this case the average laser power is advantageously between 9 and 18 W. Thus, a processing speed with reference to the CNC controlled machine axes of a laser machine tool in the range of 45 mm/min to 100 mm/min can be achieved.

According to another advantageous embodiment of the invention, the beam diameter of the laser beam in the focal point is between 7 μm and 45 μm. The focus is advantageously arranged at or proximal to the surface of the workpiece that is to be machined.

According to another advantageous embodiment of the invention the tool body is made from carbide.

According to another advantageous embodiment of the invention the layer thickness of the hard coating in the portion of the flank and of the chipping surface of the cutting edge where no material is removed is a range of 2 μm to 40 μm.

Additional advantages and advantageous embodiments of the invention can be derived from the subsequent description, the drawing figure and patent claims.

BRIEF DESCRIPTION OF THE DRAWINGS

The invention is now described based on advantageous embodiments with reference to drawing figures, wherein.

DETAILED DESCRIPTION

Figure 1:
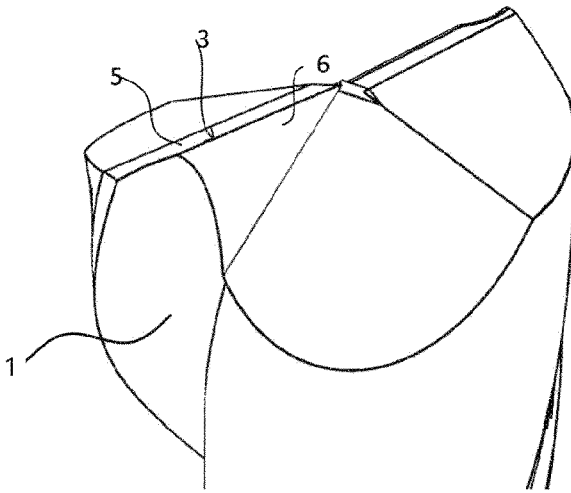
FIG. 1 illustrates a cutting tool without hard coating in a perspective view.
Figure 2:
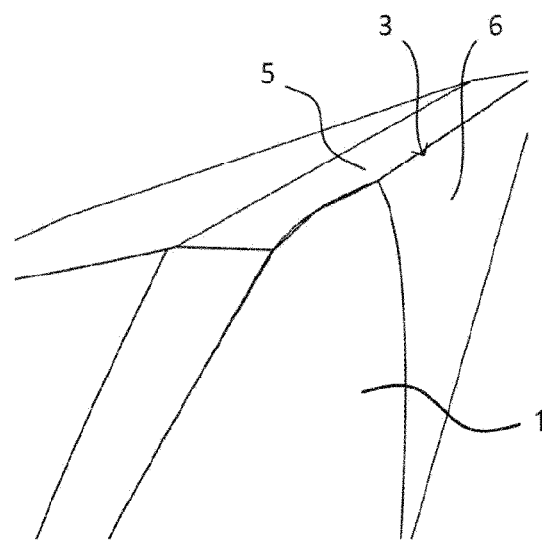
FIG. 2 illustrates a detail of the cutting tool according to FIG. 1.

FIGS. 1 through 10 illustrate a head of a cutting tool at different points in time during production. The cutting tool is a four edged end mill. FIGS. 1 and 2 show the head of the tool body 1 of the cutting tool without hard coating. The tool body 1 includes a cutting edge 3 with an associated flank 5 and an associated chipping surface 6 at a face of the tool body.

Figure 3:
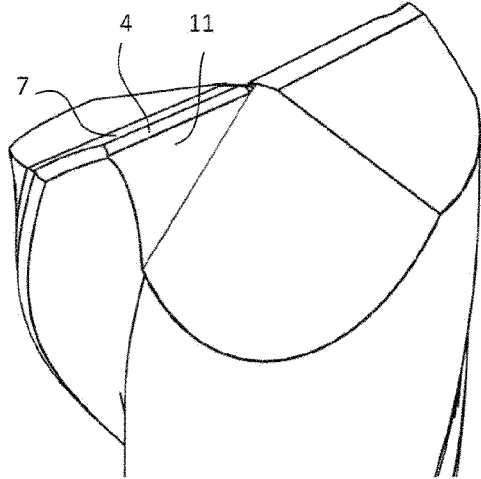
FIG. 3 illustrates the cutting tool according to FIG. 1 in a perspective view immediately after applying the hard coating and before sharpening the cutting edge.
Figure 4:
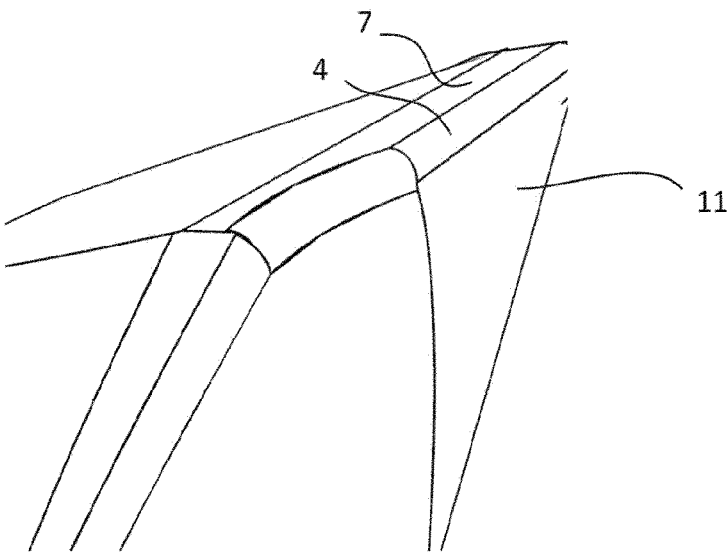
FIG. 4 illustrates a detail of the cutting tool according to FIG. 3.
Figure 5:
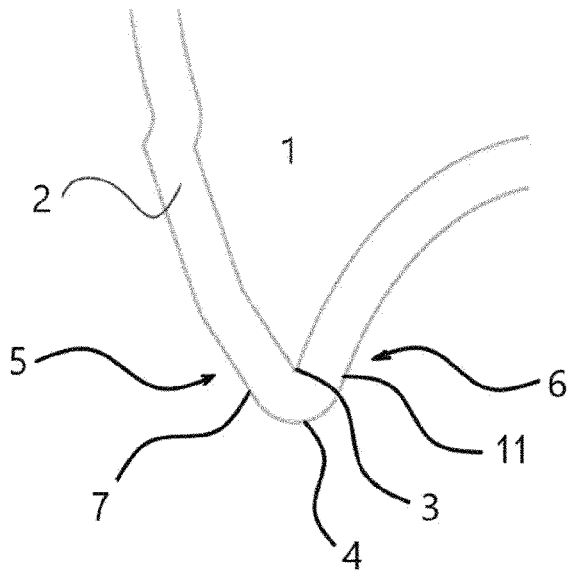
FIG. 5 illustrates a sectional view of the cutting tool according to FIG. 3 in an area of a cutting edge at a face.

FIGS. 3, 4 and 5 show the cutting tool after applying a hard coating 2 onto the tool body 1. The hard coating extends over an entire surface of the tool body 1 illustrated in FIG. 1. Applying the hard coating forms a dull rounded edge 4 along an uncoated cutting edge 3 of the tool body 1. The surface 7 of the hard coating 2 at the flank 5 and the surface 11 of the hard coating 2 at the chipping surface 6 are adjacent to the dull rounded edge 4. The hard coating 2 has a uniform layer thickness in the section illustrated in FIG. 5.

FIG. 5 shows that the edge radius of the dull rounded edge 4 is greater than the edge radius of the cutting edge 3 of the uncoated tool body 1. The cutting edge is sharpened after coating in order to reduce the edge radius of the coated cutting edge wherein the sharpening is done by partially removing the hard coating 2.

Figure 6:
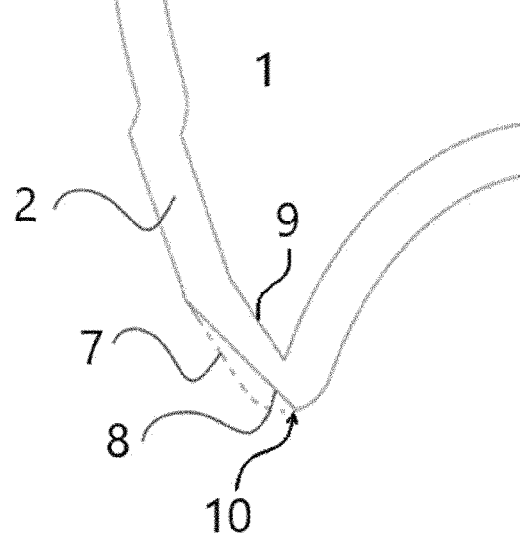
FIG. 6 illustrates a sectional view according to FIG. 5 wherein the hard coating at the flank of the cutting edge is partially removed.
Figure 7:
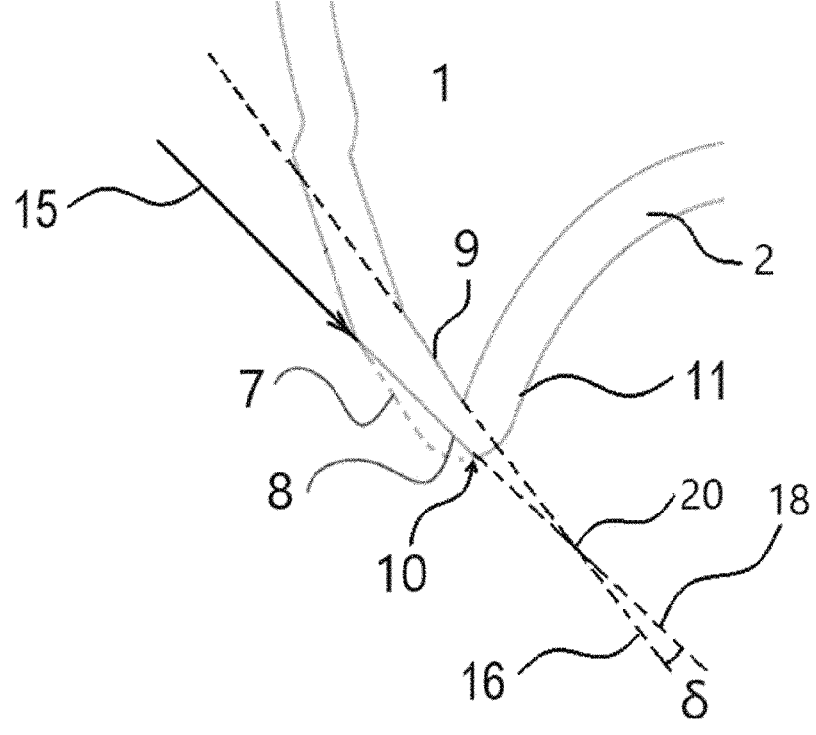
FIG. 7 illustrates the sectional view according to FIG. 6 showing the angle δ.

The removal of the hard coating 2 is illustrated in FIGS. 6 through 10. Initially a portion of the hard coating is removed at the flank as illustrated in FIGS. 6 and 7 while the chipping surface initially remains unchanged. Thus, a laser beam is oriented with its geometric beam axis 15 so that the beam axis encloses the angle δ with the first geometric plane 16. The surface 9 of the tool body 1 runs in this first geometric plane 16 under the hard coating at the flank 5. This surface 9 of the tool body 1 is defined by the cutting edge 3 of the uncoated tool body 1. The surface 9 is adjacent to the coating 2. The first geometric plane is not delimited. It extends beyond the surface 9 of the tool body 1. The original extension 7 of the surface of the hard coating 2 at the flank is drawn in dashed lines. The partial material removal has created a new surface 8 of the hard coating at the flank. This surface 8 runs in a second geometric plane 18. The first geometric plane 16 and the second geometric plane 18 do not run parallel to one another. They intersect in a geometric straight line 20. FIG. 7 only shows a point of the straight line 20 due to the viewing direction. The geometric straight line 20 runs outside the cutting tool. The first geometric plane 16 and the second geometric plane 18 enclose the angle δ. The angle δ is 10 degrees in the instant embodiment. The angle δ is shown in FIG. 7. The partial material removal at the flank generates a new sharpened cutting edge 10. FIG. 7 shows that the beam axis 15 of the laser beam essentially runs parallel or tangential to the second geometric plane 18 where the surface 8 of the hard coating extends that is generated by removing material from the flank. FIG. 7 furthermore shows that the material removal starts in a section of the flank that is oriented away from the cutting edge and continues along the second geometric plane 18 to the chipping surface.

Figure 8:
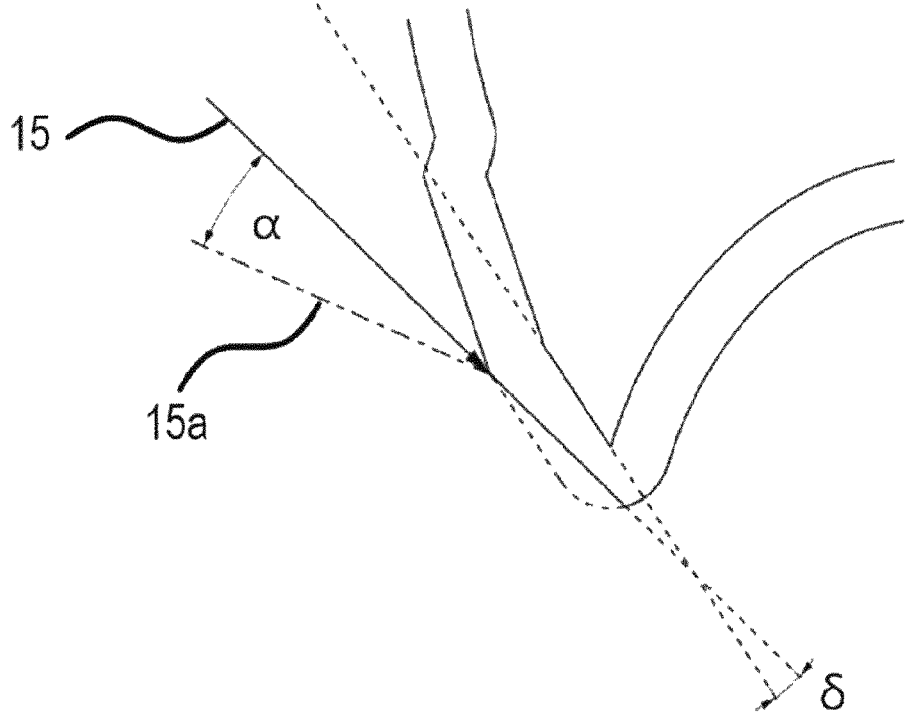
FIG. 8 illustrates the sectional view according to FIG. 7 showing the angle α.

FIG. 8 shows an alternative orientation of the beam axis 15 of the laser beam that differs from FIG. 7. The beam axis 15a of the laser beam is inclined at an angle α relative to the orientation 15, wherein the angle α corresponds to half the opening angle of the laser beam. α typically has a value between 1° degree and 10°.

Figure 9:
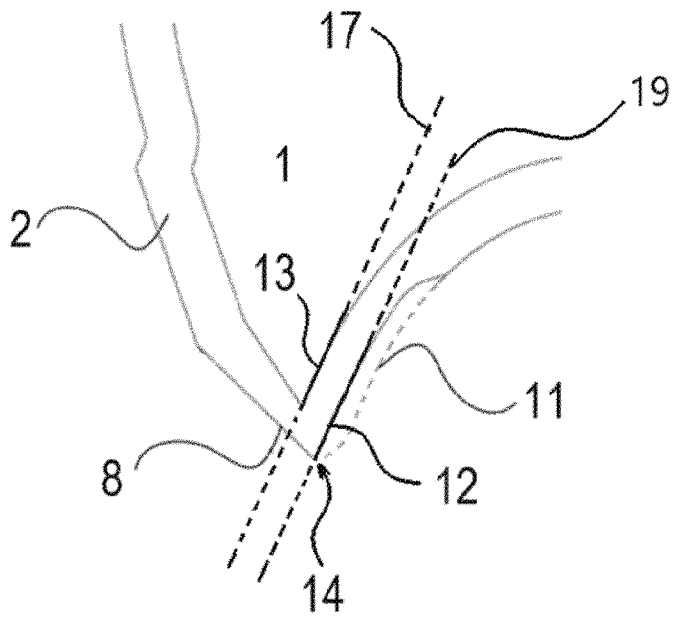
FIG. 9 illustrates the sectional view of the cutting tool according to FIGS. 3 and 5, wherein the hard coating at the flank and at the chipping surface of the cutting edge is partially removed.

FIGS. 9, 10, 11 and 12 show the cutting tool after an additional portion of the hard coating 2 is removed at the chipping surface. The original extension 11 of the surface of the hard coating at the chipping surface is illustrated in FIG. 9 in dashed lines. The partial material removal generates a new surface 12 of the hard coating at the chipping surface. This surface 12 is parallel to the underlying surface 13 of the tool body 1. The surface 13 runs in a third geometric plane 17. The surface 12 runs in a fourth geometric plane 19. The angle ε between the two surfaces 12 and 13 is 0° in this embodiment. Accordingly the angle ε between the third geometric plane 17 and the fourth geometric plane 19 is also 0°. The third geometric plane 17 and the fourth geometric plane do not intersect. Partial material removal at the chipping surface generates a new sharpened cutting edge 14.

Figure 10:
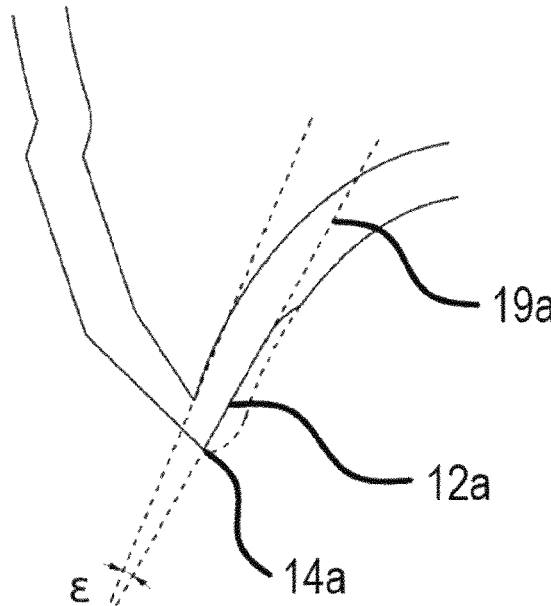
FIG. 10 illustrates a sectional view of the cutting tool according to FIGS. 3 and 5, wherein the hard coating at the flank is partially removed and the hard coating from the chipping surface of the cutting edge is partially removed in a manner that differs from FIG. 9.
Figure 11:
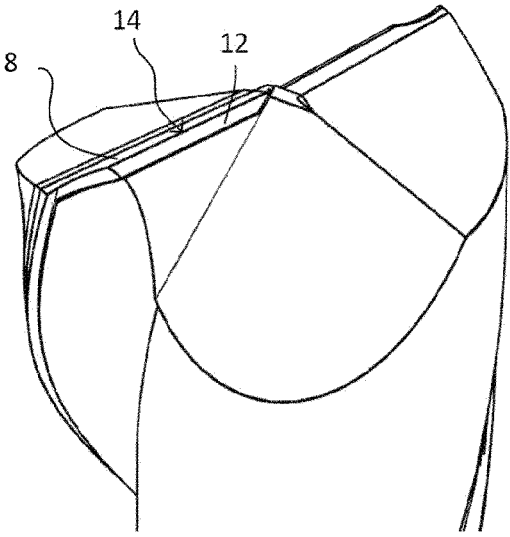
FIG. 11 illustrates the cutting tool according to FIG. 3 wherein the hard coating at the flank and at the chipping surface of the cutting edge is removed according to FIG. 9.
Figure 12:
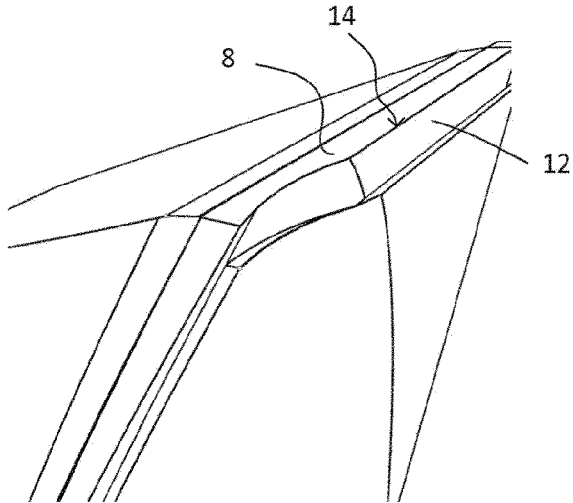
FIG. 12 illustrates a detail of the cutting tool according to FIG. 11.

FIG. 10 illustrates an alternative to FIG. 9. Thus, material is removed from the chipping surface so that the angle ε differs from 0°. The new surface 12a of the hard coating at the chipping surface generated by the material removal is not parallel to the surface 13 of the tool body 1 arranged thereunder. The fourth geometric plane 19a where the new surface 12a extends intersects the third geometric plane 17 along a straight line and encloses the angle ε=3° with the third geometric plane 17. The partial material removal at the chipping surface generates a new sharpened cutting edge 14a.

Figure 13:
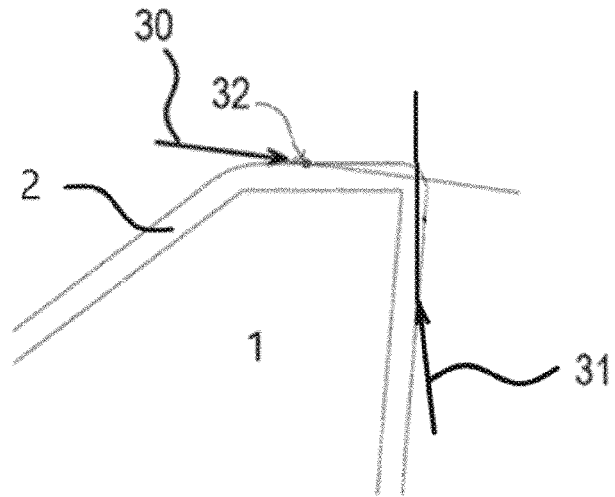
FIG. 13 illustrates an orientation of the laser beam during material removal at the cutting tool according to FIGS. 6 through 12, wherein the material removal is performed in a portion of a cutting edge at the face of the cutting tool.

FIG. 13 shows an orientation of the beam axis of the laser beam during material removal at the flank and at the chipping surface when the associated cutting edge is in a portion of the face of the cutting tool. The first orientation of the beam axis 30 is provided during material removal at the flank. This first orientation essentially corresponds to the orientation of the beam axis 15 of the laser beam in FIG. 7 or to the orientation of the beam axis 15a of the laser beam in FIG. 8. The laser beam impacts the surface of the hard coating 2 of the tool body 1 at the point 32. The material removal commences in a section of the flank oriented away from the cutting edge and terminates at the chipping surface along the shortened cutting edge. It is an advantage of this orientation of the laser beam that portions that are impacted by the laser beam are removed in their entirety. The hard coating that remains at the cutting tool does not include impact spots. Therefore the surface at the flank that is generated by the material removal is very smooth. This applies accordingly to the material removal at the chipping surface. At this location the beam axis 31 of the laser beam also has an orientation that is parallel or tangential to the surface to be generated or encloses an angle α between 1° and 10° with this surface. This way a very smooth surface of the hard coating can also be generated at the chipping surface. The material removal commences in a section of the chipping surface that is oriented away from the cutting edge and terminates at the flank along the sharpened cutting edge.

Figure 14:
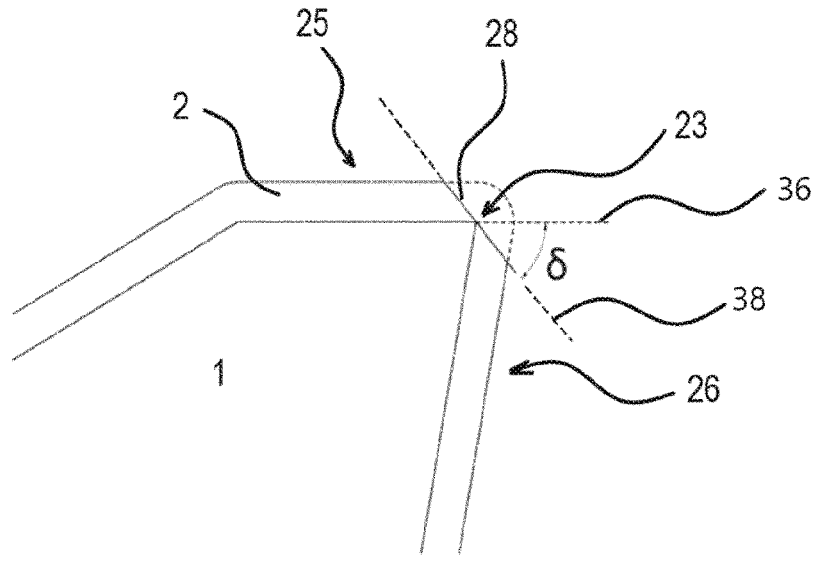
FIG. 14 illustrates another cutting edge of the cutting tool according to FIG. 3.

FIG. 14 shows the material removal at another cutting edge 23 of the cutting tool according to FIG. 3. Thus, the hard coating 2 is removed from the tool body 1 starting at the flank 25 and moving towards the chipping surface 26 so that a new surface 28 of the hard coating is generated at the flank. This new surface 28 extends in a second geometric plane 38.

The surface of the tool body 1 that is arranged under the hard coating 2 at the flank 25 extends in a first geometric plane 36. The first geometric plane 36 and the second geometric plane 38 intersect at the angle δ in the cutting edge 23 of the tool body 1. The angle δ is 50° in the instant embodiment. Removing the material and thus generating the new surface 28 removes the hard coating at the cutting edge 23 of the tool body 1, so that the cutting edge 23 does not include any hard coating.

Figure 15:
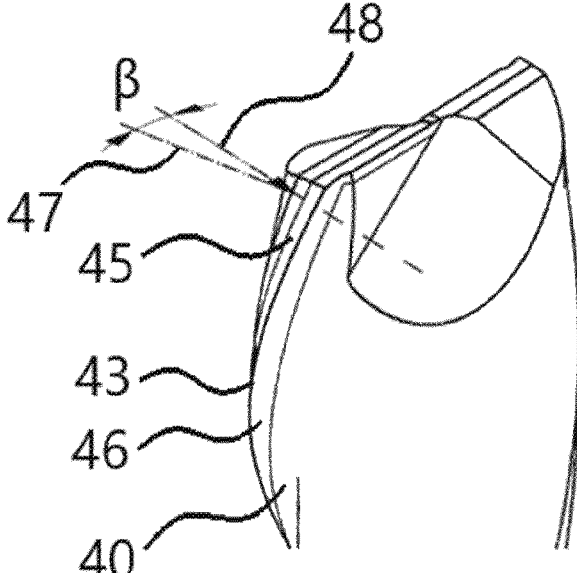
FIG. 15 illustrates an orientation of the laser beam during material removal from the cutting tool according to FIGS. 6 through 12 at a flank of a cutting edge in an area of a chip flute.
Figure 16:
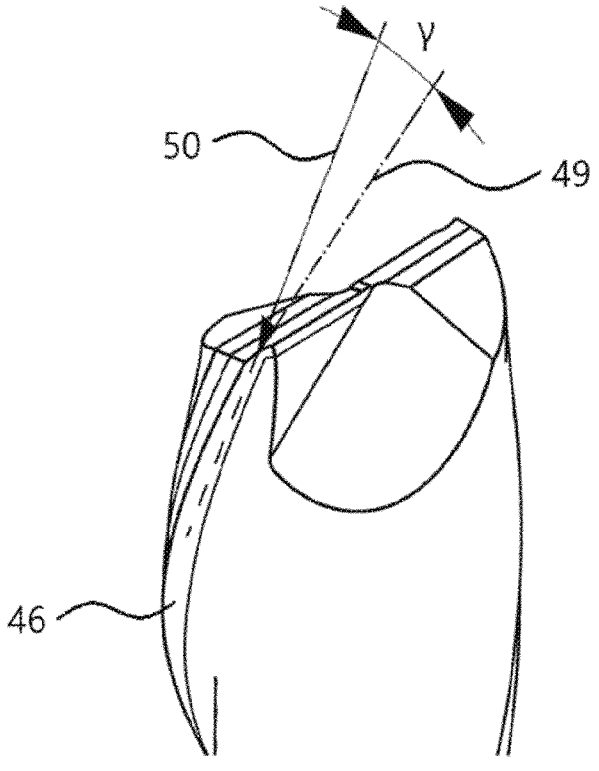
FIG. 16 illustrates an orientation of the laser beam during material removal from the cutting tool according to FIGS. 6 through 12 at a chipping surface of a cutting edge in an area of the chip flute at a beginning of the material removal.
Figure 17:
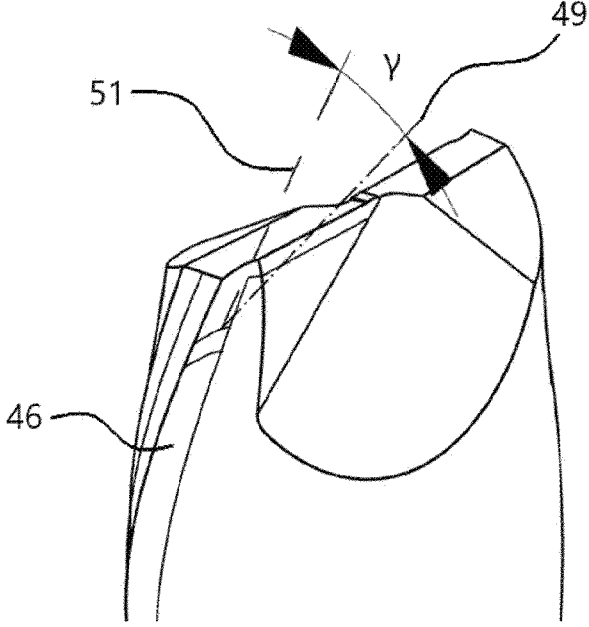
FIG. 17 illustrates progressing material removal at the chipping surface in an area of the cutting edge of the chip flute.

FIGS. 15, 16 and 17 show the partial material removal at a flank and a chipping surface along a chip flute 40 of the cutting tool according to FIGS. 1 through 12. Another cutting edge 43 with an associated flank 45 and an associated chipping surface 46 extends along the chip flute 40. This cutting edge 43 is also sharpened by a partial material removal after applying a hard coating. The chip flute 40 is an elongated recess between two cutting edges which extend in a spiral shape at an outside of the shaft of the cutting tool. FIGS. 15 through 17 only show the cutting edge 43 of the two cutting edges. The other cutting edge is arranged at a side of the cutting tool oriented away from the viewer. The chip flute 40 receives cut off chips while the cutting edges of the cutting tool engage a workpiece.

FIG. 15 shows how the geometric beam axis 47 of the laser beam is oriented when removing material from the flank 45. Thus the geometric beam axis 47 encloses an angle β with a tangent 48 at the surface of the flank 45 that is being generated. This angle typically corresponds to half the opening angle of the laser beam. The angle β can coincide with the angle α according to FIG. 8. This, however, is not mandatory. Since the flank 45 of the cutting edge 43 is arranged at an outward oriented section of the cutting tool the geometric beam axis 47 of the laser beam can be arranged in a plane that is essentially orthogonal to a geometric longitudinal axis of the cutting tool.

FIGS. 16 and 17 show how the geometric beam axis 49 of the laser beam is oriented when material is removed at the chipping surface 46. FIG. 16 shows the orientation of the geometric beam axis at a beginning of the material removal at the face of the cutting tool. FIG. 17 shows the orientation of the geometric beam axis 49 when the material removal has already progressed along the chip flute 40 in the axial direction. The geometric beam axis 49 is inclined by an angle γ in both cases relative to a tangent 50, 51 at the surface to be machined. Since the chipping surface 46 is arranged at the inward cambered surface of the chip flute a geometric beam axis 49 of the laser beam has to be oriented differently from the illustration in FIG. 15 so that the laser beam impacts the surface of the cutting tool at the predetermined position and in the tangential direction.

The invention can be implemented by any of the described features individually or in any combination.

REFERENCE NUMERALS AND
DESIGNATIONS

1 tool body
2 hard coating
3 cutting edge of tool body
4 dull rounded edge
5 flank
6 chipping surface
7 original extension of the surface of the hard coating at the flank
8 extension of the surface of the hard coating at the flank after partial material removal
9 surface of the tool body at the flank

10 resharpened coated cutting edge
11 original extension of the surface of the hard coating at the chipping surface
12 extension of the surface of the hard coating at the chipping surface after partial material removal
12a extension of the surface of the hard coating at the chipping surface after partial material removal according to an embodiment
13 surface of the tool body at the chipping surface
14 resharpened coated cutting edge
14a resharpened coated cutting edge according to an embodiment
15 geometric beam axis of a laser beam
15a geometric beam axis of a laser beam
16 first geometric plane
17 third geometric plane
18 second geometric plane
19 fourth geometric plane
19a fourth geometric plane according to an embodiment
20 geometric straight line in which the first and the second geometric planes intersect
23 cutting edge of the tool body
25 flank
26 chipping surface
28 extension of the surface of the hard coating at the flank after partial material removal
30 first embodiment of the beam axis of the laser beam
31 second embodiment of the beam axis of the laser beam
32 impact point of the laser beam at the surface of the hard coating
36 first geometric plane
38 second geometric plane
40 chip flute
43 cutting edge
45 flank
46 chipping surface
47 geometric beam axis of the laser beam
48 tangent at the surface of the flank to be machined
49 geometric beam axis of the laser beam
50 tangent at the surface of the flank to be machined
51 tangent at the surface of the flank to be machined

What is claimed is:

1. A method for producing a cutting tool including a tool body including a hard coating configured harder than a remainder of the tool body, the method comprising:

depositing the hard coating on a surface of the tool body of the cutting tool in an area of a cutting edge, in an area of a flank adjacent to the cutting edge, and in an area of a chipping surface adjacent to the cutting edge;

sharpening the cutting edge that is provided with the hard coating and that forms a dull rounded edge by partially removing the hard coating in the area of the flank of the cutting edge by laser machining to form a sharpened cutting edge so that an angle δ is enclosed between a first geometric plane in which a surface of the tool body extends, wherein the surface of the tool body is arranged below the hard coating of the flank, and a second geometric plane in which a surface of the hard coating defined by the sharpened cutting edge extends in the area of the flank after the partial removing of the hard coating, wherein the partial removing of the hard coating is performed so that $2° \leq \delta \leq 10°$, and wherein a geometric beam axis of a laser beam is oriented during the laser machining so that the geometric beam axis encloses the angle δ or an angle α+δ with the first geometric plane, wherein $1° \leq \alpha \leq 10°$.

2. The method according to claim 1, wherein the hard coating is deposited on the tool body with a layer thickness between 2 μm and 40 μm.

3. The method according to claim 1, wherein the partial removing of the hard coating reduces the thickness of the hard coating at the flank, so that a thickness of the hard coating increases from the sharpened cutting edge with an increasing distance from the sharpened cutting edge.

4. The method according to claim 1, wherein the partial removing of the hard coating starts at the flank of the hard coating in a section of the flank that is distal from the cutting edge of the tool body and the partial removing of the hard coating terminates at the chipping surface.

5. The method according to claim 1, wherein the cutting edge provided with the hard coating is sharpened by an additional partial removal of the hard coating in a portion of the chipping surface by laser machining so that an angle ε is enclosed between a third geometric plane in which the surface of the tool body extends that is arranged under the hard coating of the chipping surface and a fourth geometric plane in which a surface of the hard coating defined by the sharpened cutting edge extends in the area of the chipping surface after the additional partial removal of the hard coating, wherein 0°≤ε≤70°.

6. The method according to claim 5, wherein the hard coating is removed so that 2°≤ε≤10°.

7. The method according to claim 5, wherein the partial removing of the hard coating reduces the thickness of the hard coating at the chipping surface so that the thickness of the hard coating at the chipping surface increases from the sharpened cutting edge with an increasing distance from the sharpened cutting edge.

8. The method according to claim 1, wherein a diamond layer is deposited at the tool body as the hard coating.

9. The method according to claim 1, wherein the hard coating is removed from the flank completely at least in sections so that the tool body is exposed in the sections.

10. The method according to claim 1, wherein the hard coating is removed from the chipping surface completely at least in sections, so that the tool body is exposed in the sections.

11. The method according to claim 1, wherein the laser machining is performed by a pulsed laser beam, wherein a pulse duration is between 50 ns and 150 fs.

12. The method according to claim 1, wherein the laser machining is performed by a pulsed laser beam, wherein a pulse duration is between 190 fs and 10 ps.

13. The method according to claim 11, wherein a pulse frequency is between 100 KHz and 1,000 KHz.

14. The method according to claim 1, wherein an average laser power is between 4 W and 40 W.

15. The method according to claim 14, wherein the pulse duration is between 6 ns and 45 ns and a pulse frequency is between 15 KHz and 200 kHz.

16. The method according to claim 15, wherein an average laser power is between 9 W and 18 W.

17. The method according to preceding claim 1, wherein a beam diameter of the laser beam in a focal point is between 7 μm and 25 μm.

* * * * *